(12) United States Patent
Yamamoto

(10) Patent No.: US 10,153,749 B2
(45) Date of Patent: *Dec. 11, 2018

(54) RESONATOR ELEMENT, RESONATOR, AND ELECTRONIC DEVICE

(71) Applicant: Seiko Epson Corporation, Tokyo (JP)

(72) Inventor: Yusuke Yamamoto, Minowa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/830,867

(22) Filed: Dec. 4, 2017

(65) Prior Publication Data

US 2018/0091117 A1    Mar. 29, 2018

Related U.S. Application Data

(63) Continuation of application No. 14/501,500, filed on Sep. 30, 2014, now Pat. No. 9,866,198.

(30) Foreign Application Priority Data

Oct. 1, 2013  (JP) ................. 2013-206162

(51) Int. Cl.
*H03H 9/17* (2006.01)
*H03H 9/05* (2006.01)
*H03H 9/10* (2006.01)

(52) U.S. Cl.
CPC .......... *H03H 9/171* (2013.01); *H03H 9/0542* (2013.01); *H03H 9/1021* (2013.01)

(58) Field of Classification Search
CPC ............ H03H 9/17; H03H 9/19; H03H 9/171; H03H 9/0542; H03H 9/1021
See application file for complete search history.

(56) References Cited

U.S. PATENT DOCUMENTS

| 6,232,699 | B1 | 5/2001 | Wajima |
| 7,745,980 | B2 | 6/2010 | Furue et al. |
| 8,164,235 | B2 | 4/2012 | Koyama |
| 9,013,243 | B2* | 4/2015 | Ishii ......................... H03B 5/32 |
| | | | 310/365 |
| 9,866,198 | B2* | 1/2018 | Yamamoto ............. H03H 9/171 |
| 2010/0327705 | A1 | 12/2010 | Koyama |
| 2012/0306321 | A1 | 12/2012 | Ishii |
| 2013/0043959 | A1 | 2/2013 | Ishii |
| 2013/0043960 | A1 | 2/2013 | Ishii et al. |

(Continued)

FOREIGN PATENT DOCUMENTS

| JP | 09-246903 A | 9/1997 |
| JP | 2002-111435 A | 4/2002 |
| JP | 2002-190717 A | 7/2002 |

(Continued)

*Primary Examiner* — J. San Martin

(74) *Attorney, Agent, or Firm* — Harness, Dickey & Pierce, P.L.C.

(57) ABSTRACT

A resonator element includes a substrate that vibrates in a thickness shear vibration, a first excitation electrode that is provided on one main surface of the substrate and has a shape in which at least three corners of a virtual quadrangle are cut out, and a second excitation electrode that is provided on the other main surface of the substrate, and a ratio (S2/S1) of an area S1 of the virtual quadrangle and an area S2 of the first excitation electrode satisfies a relationship of 69.2%≤ (S2/S1)≤80.1%.

17 Claims, 10 Drawing Sheets

(56) References Cited

U.S. PATENT DOCUMENTS

2013/0257554 A1  10/2013  Ishii et al.
2016/0028369 A1   1/2016  Yamamoto

FOREIGN PATENT DOCUMENTS

| JP | 2002-368573 A | 12/2002 |
| JP | 2004-146963 A | 5/2004 |
| JP | 2004-179879 A | 6/2004 |
| JP | 2007-158486 A | 6/2007 |
| JP | 2007-214941 A | 8/2007 |
| JP | 2009-089441 A | 4/2009 |
| JP | 2010-193496 A | 9/2010 |
| JP | 2011-147053 A | 7/2011 |
| JP | 2011-160094 A | 8/2011 |
| JP | 2012-249099 A | 12/2012 |
| JP | 2013-046085 A | 3/2013 |
| JP | 2013-207338 A | 10/2013 |
| JP | 2014-158149 A | 8/2014 |
| WO | WO-2009-020022 A1 | 2/2009 |

* cited by examiner

| No. | hx [mm] | hz [mm] | S1 [mm²] | S2 [mm²] | S2/S1 [%] | C1 [fF] | Δf [ppm] |
|---|---|---|---|---|---|---|---|
| 1 | 0.843 | 0.668 | 0.564 | 0.470 | 83.3 | 9.06 | 1,615 |
| 2 | 0.861 | 0.682 | 0.587 | 0.470 | 80.0 | 9.18 | 1,560 |
| 3 | 0.878 | 0.696 | 0.611 | 0.470 | 76.9 | 9.48 | 1,396 |
| 4 | 0.895 | 0.709 | 0.634 | 0.470 | 74.1 | 9.35 | 1,451 |
| 5 | 0.911 | 0.722 | 0.658 | 0.470 | 71.4 | 9.49 | 1,322 |
| 6 | 0.927 | 0.735 | 0.681 | 0.470 | 68.8 | 9.75 | 1,280 |
| 7 | 0.943 | 0.748 | 0.705 | 0.470 | 66.3 | 9.80 | 1,260 |

RESONATOR ELEMENT, RESONATOR, AND ELECTRONIC DEVICE

CROSS-REFERENCE TO RELATED APPLICATIONS

This application is a continuation of the U.S. patent application Ser. No. 14/501,500, filed on Sep. 30, 2014, which claims priority to Japanese Patent Application No. 2013-206162, filed on Oct. 1, 2013. The disclosures of the above applications are incorporated by reference in their entireties.

BACKGROUND

1. Technical Field

The present invention relates to a resonator element which excites thickness shear vibration, and a resonator, an electronic device, an electronic apparatus, and a moving object using the same.

2. Related Art

Since an AT cut quartz crystal resonator that excites thickness shear vibration which is main vibration is suitable for miniaturization and increasing a frequency and exhibits a cubic curve which has an excellent frequency-temperature characteristic, it has been used in various fields such as oscillators and electronic apparatuses. Particularly, in recent years, as the processing speed of transmission communication equipment or OA equipment is increased or the volume of communication data and the processing capacity are increased, there has been a strong request for increasing a frequency for the AT cut quartz crystal resonator which is a reference frequency signal source used therein. For increasing the frequency of the AT cut quartz crystal resonator that excites the thickness shear vibration, it is common to increase the frequency by reducing a thickness of the vibrating portion.

However, if the thickness of the vibrating portion is reduced along with increasing the frequency, the adjustment sensitivity of the frequency is increased, and thus there is a problem of a final frequency accuracy being poor and the production yield of a resonator being lowered. In contrast, JP-A-2002-111435 discloses a resonator element of a temperature compensated oscillator in which four corners of an excitation electrode having a rectangular shape are cut out to be substantially equal and the ratio of an area after cutting to an area before cutting is set to be 95% to 98%, which allows the capacitance ratio γ of the resonator (=C0/C1, here, C0 is an equivalent parallel capacitance, and C1 is an equivalent serial capacitance) to be reduced, and the frequency variable sensitivity is increased, which allows a margin for fitting the oscillation frequency to be increased.

However, since there is a high possibility of the main vibration being coupled with spurious vibration due to a variation in a plane parallelism degree of the thickness of the vibrating portion and a frequency jump phenomenon occurs, there is a problem of oscillation being unstable.

SUMMARY

An advantage of some aspects of the invention is to solve at least a part of the problems described above, and the invention can be implemented as the following forms or application examples.

Application Example 1

This application example is directed to a resonator element including a substrate that vibrates in a thickness shear vibration and includes a first main surface and a second main surface which are in a front and back relationship to each other; a first excitation electrode that is provided on the first main surface; and a second excitation electrode that is provided on the second main surface, and overlaps the first excitation electrode in a plan view, in which a region of the substrate which is interposed between the first excitation electrode and the second excitation electrode includes a side or a circumference being in contact with a virtual quadrangle having four corners which are all the same size in a plan view, in which the region includes an outer edge that does not overlap at least three corners of the quadrangle, in a plan view, and in which when an area of the quadrangle is set to S1, and an area of the first excitation electrode is set to S2, a relationship of 69.2%≤(S2/S1)≤80.1% is satisfied.

According to this application example, there is an effect of obtaining a resonator element which is stable and vibrates by the main vibration, by forming the region which is interposed between the first excitation electrode and the second excitation electrode into a shape in which three corners of the quadrangle are cut out.

In other words, since the vibration region of the main vibration is concentrated in the central portion of the excitation electrode, even if an electrode is shaped in such a manner that three corners of the excitation electrode are cut out, the influence to the frequency change is small, and the frequency of the main vibration hardly changes. However, since the vibration region of the spurious vibration due to the variation or the like in the plane parallelism degree of the thickness of the vibrating portion is concentrated in four corners or the peripheral portion of the excitation electrode, when the region interposed between the first excitation electrode and the second excitation electrode is shaped into an electrode shape in which three corners of the quadrangle are cut out, the area of the excitation electrode on the vibration region of the spurious vibration is reduced as if the film thickness of the excitation electrode is reduced, and thus the frequency of the spurious vibration is increased. Therefore, there is an effect of obtaining a resonator element that is stable and vibrates by the main vibration.

Further, since at least three out of four corners of the excitation electrode not actually contributing to the vibration of the main vibration are cut out, it is possible to efficiently trap the vibration energy of the main vibration and increase the equivalent series capacitance C1, and reduce the equivalent parallel capacitance C0 determined by an area of the excitation electrode, such that there is an effect capable of obtaining the resonator element with a small capacitance ratio γ.

Application Example 2

This application example is directed to the resonator element according to the application example described above, wherein the region includes an outer edge that does not overlap four corners of the quadrangle, in a plan view.

According to this application example, a shape in which four corners of the excitation electrode not contributing to actual vibration of the main vibration are cut out is used, while the frequency of the main vibration is hardly changed, it is possible to reduce the electrode area of the region in which the vibration region of the spurious vibration is concentrated, thereby increasing the frequency of the spurious vibration. Therefore, there is an effect capable of obtaining a resonator element in which the frequency jump phenomenon due to the coupling with the spurious vibration is reduced.

Further, since the excitation electrode can be made small, there is an effect capable of obtaining a resonator element with a small capacitance ratio γ.

Application Example 3

This application example is directed to the resonator element according to the application example described above, wherein the first excitation electrode fits inside the outer edge of the second excitation electrode, in a plan view.

According to this application example, when the first excitation electrode and the second excitation electrode are formed by a metal mask method, even if there is some positional shift of the mask, it is difficult to change the area in which the first excitation electrode and the second excitation electrode overlap in a plan view, such that there is an effect of obtaining the resonator element in which the variation of the equivalent series capacitance C1 and the equivalent parallel capacitance C0 is unlikely to occur and the variation of the capacitance ratio γ is small.

Since the thickness shear vibration vibrates only in a region in which the first excitation electrode and the second excitation electrode overlap in a plan view, when the first excitation electrode fits into the inside of the outer edge of the second excitation electrode, efficiently trapping the vibration energy of the main vibration can be determined by the area and the thickness of the first excitation electrode.

Therefore, since it is possible to increase the thickness of the electrode compared to a case where the areas of the first excitation electrode and the second excitation electrode are the same, there is an effect capable of reducing the ohmic loss of the electrode film, and reducing the deterioration of the CI value of the main vibration.

Application Example 4

This application example is directed to the resonator element according to the application example described above, which includes a lead electrode extending from an outer edge out of a region that does not overlap the corners of the quadrangle, among outer edges of the first excitation electrode.

According to this application example, since the lead electrode extends from the outer edge of the first excitation electrode, except for a region in which a lead electrode is cut out, it is possible to reliably reduce the area of the first excitation electrode of the vibration region of the spurious vibration which is concentrated in the peripheral portion of the first excitation electrode, and there is an effect of obtaining a resonator element capable of reducing the coupling with the main vibration by increasing the frequency of the spurious vibration.

Application Example 5

This application example is directed to the resonator element according to the application example described above, wherein the substrate is a quartz crystal substrate.

According to this application example, the quartz crystal substrate has a high Q value and an excellent temperature characteristic, such that there is an effect of obtaining a resonator element having a stable vibration characteristic.

Application Example 6

This application example is directed to the resonator element according to the application example described above, wherein the quartz crystal substrate is an AT cut quartz crystal substrate.

According to this application example, there is an effect capable of realizing the resonator element which has the excellent frequency-temperature characteristic, by using the AT cut quartz crystal substrate having a cutting angle which has the excellent temperature characteristic as the substrate.

Application Example 7

This application example is directed to the resonator element according to the application example described above, wherein when the length along the thickness shear vibration direction of the first excitation electrode is set to hx and the length along the direction orthogonal to the thickness shear vibration direction is set to hz, a relationship of $1.25 \leq hx/hz \leq 1.31$ is satisfied.

According to this application example, when using a substrate in which the displacement distribution of the displacement direction defined by the quartz crystal anisotropy and the displacement distribution of the direction orthogonal thereto are different, it is possible to increase the efficiency of energy trapping of the main vibration, such that the equivalent series capacitance C1 is increased and to further reduce the capacitance ratio γ of the resonator element.

Application Example 8

This application example is directed to a resonator including the resonator element according to the application example described above, and a package accommodating the resonator element.

According to this application example, since the resonator element is accommodated in the package, a resonator with highly reliable quality is obtained.

For example, since it is possible to prevent an influence of disturbance such as a temperature change or a humidity change and an influence of contamination, there is an effect of obtaining a resonator which has an excellent frequency reproducibility, a frequency-temperature characteristic, a CI-temperature characteristic, and a frequency aging characteristic.

Application Example 9

This application example is directed to an electronic device including the resonator element according to the application example described above, and an oscillation circuit that drives the resonator element.

According to this application example, there is an effect of obtaining an electronic device in which main vibration of the resonator element has a stable characteristic.

For example, there is an effect of obtaining a voltage-controlled electronic device which has a stable oscillation characteristic in which the frequency jump phenomenon due to coupling with the spurious vibration is reduced because the frequency difference between the main vibration and the spurious vibration of the resonator element is wide, and has a wide frequency variable width because the capacitance ratio γ of the resonator element is small.

Further, it is possible to configure an oscillator and a temperature compensated oscillator as an electronic device, and thus there is an effect capable of configuring an oscillator which has an excellent frequency reproducibility, an aging characteristic, and a frequency-temperature characteristic.

Application Example 10

This application example is directed to an electronic apparatus including the resonator element according to the application example described above.

According to this application example, there is an effect capable of configuring a high-performance electronic apparatus, by using the resonator element in which main vibration has a stable characteristic in an electronic apparatus.

Application Example 11

This application example is directed to a moving object including the resonator element according to the application example described above.

According to this application example, since the moving object includes a resonator element in which main vibration has a stable characteristic, it is possible to obtain a moving object of higher performance.

BRIEF DESCRIPTION OF THE DRAWINGS

The invention will be described with reference to the accompanying drawings, wherein like numbers reference like elements.

FIG. 1A is a plan view of the resonator element, FIG. 1B is a sectional view taken along line P-P, and FIG. 1C is a sectional view taken along line Q-Q.

FIG. 3A is a plan view, and FIG. 3B is a longitudinal sectional diagram of FIG. 3A.

FIG. 6A is a plan view of a first modification example, FIG. 6B is a plan view of a second modification example, and FIG. 6C is a plan view of a third modification example.

FIG. 7A is a plan view, and FIG. 7B is a longitudinal sectional view.

FIG. 8A is a plan view, and FIG. 8B is a longitudinal sectional view.

DESCRIPTION OF EXEMPLARY EMBODIMENTS

Figures 1A, 1B, 1C:
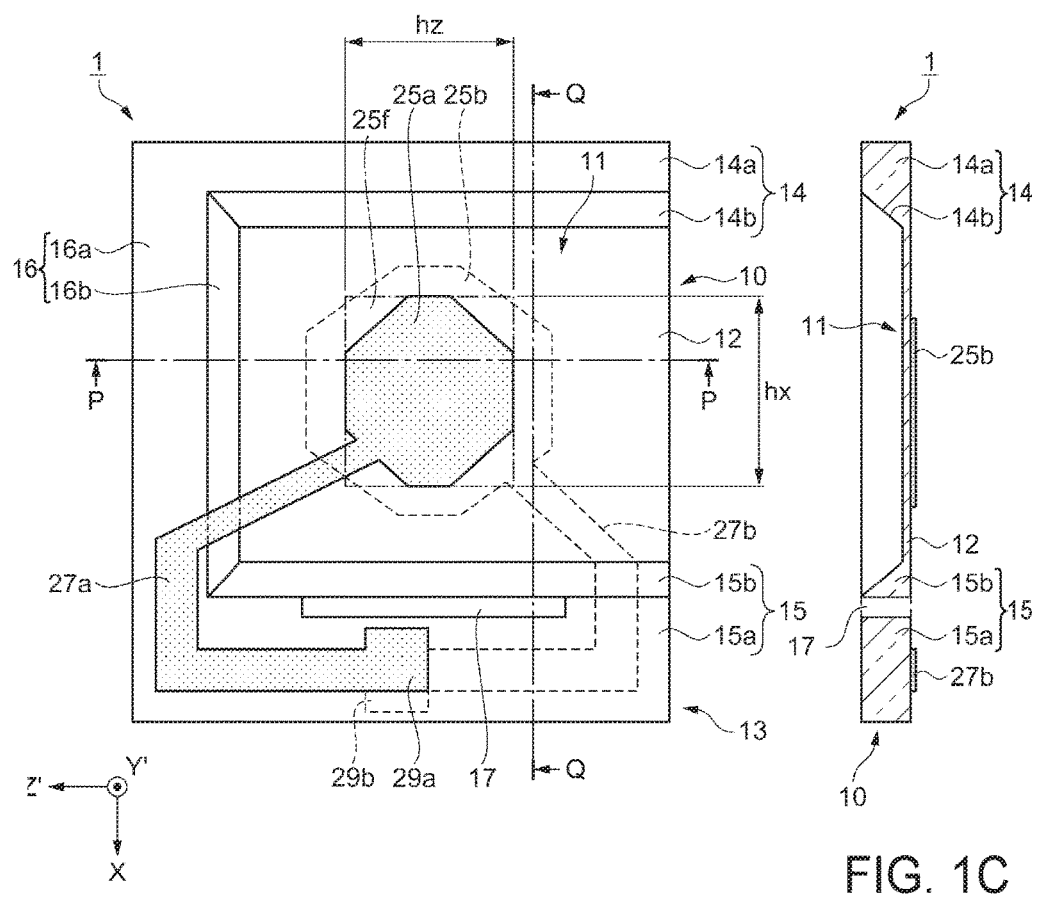
FIGS. 1A to 1C are schematic diagrams illustrating a configuration of a resonator element according to an embodiment of the invention.

Hereinafter, a resonator element, a resonator, an electronic device, an electronic apparatus, and a moving object according to the invention will be described based on preferred embodiments illustrated in the drawings.
Resonator Element First, a resonator element according to the invention will be described.

FIGS. 1A to 1C are schematic diagrams illustrating a configuration of a resonator element according to an embodiment of the invention, FIG. 1A is a plan view of the resonator element, FIG. 1B is a sectional view taken along line P-P of FIG. 1A, and FIG. 1C is a sectional view taken along line Q-Q of FIG. 1A.

The resonator element 1 includes a substrate 10 having a vibrating portion 12 and a thick portion 13 which is provided continuously to the vibrating portion 12 and is thicker than the thickness of the vibrating portion 12, a first excitation electrode 25a and a second excitation electrode 25b which are formed on both main surfaces (front and back surfaces in ±Y' directions) of the vibrating portion 12 so as to be opposed to each other, and lead electrodes 27a and 27b which respectively extend from the first excitation electrode 25a and the second excitation electrode 25b toward the pad electrodes 29a and 29b provided in the thick portion.

The substrate 10 forms a rectangular shape and includes a vibrating portion 12 which is thin and has a flat plate shape of a constant thickness orthogonal to a Y' axis, a thick portion 13 formed of a first thick portion 14, a second thick portion 15, and a third thick portion 16 (also referred to as first, second, and third thick portions 14, 15, and 16) which are respectively integrated into three sides of the vibrating portion 12 except for one side thereof, and a slit 17 for preventing mounting stress caused at the time of supporting and fixing from propagating to the vibrating portion 12.

In addition, a first thick main body 14a, a second thick main body 15a, and a third thick main body 16a (also referred to as first, second, and third thick main bodies 14a, 15a, and 16a) refer to regions that are parallel to the Y' axis and have a constant thickness.

Further, a first inclined portion 14b, a second inclined portion 15b, and a third inclined portion 16b (also referred to as first, second, and third inclined portions 14b, 15b, and 16b) refer to inclined surfaces that are formed between the first, second and third thick main bodies 14a, 15a, and 16a and the vibrating portion 12.

One main surface of the vibrating portion 12 and one surface of the respective first, second and third thick portions 14, 15, and 16 are located on the same plane, that is, on the X-Z' plane of coordinate axes illustrated in FIGS. 1A to 1C, this surface (a lower surface located in a -Y' direction of FIG. 1B) is referred to as a flat surface, and a surface (an upper surface located in a +Y' direction of FIG. 1B) on the opposite side having a concave portion 11 is referred to as a concave surface.

In the embodiment illustrated in FIGS. 1A to 1C, the first excitation electrode 25a is formed into a quadrangle shape, preferably, a shape in which four corners of the rectangle are cut, that is, a shape in which sides are inscribed to a virtual quadrangle 25f made with a length hx along the X axis direction and a length hz along the Z' axis direction and four corners of the virtual quadrangle 25f are cut. Further, similarly to the first excitation electrode 25a, the second excitation electrode 25b is formed into a quadrangle shape, preferably, a shape in which four corners of the rectangle are cut. The first excitation electrode 25a and the second excitation electrode 25b are respectively formed on both main surfaces (front surface and back surface) in an approximately center portion of the vibrating portion 12 so as to overlap in a plan view. In addition, the shape of the second excitation electrode 25b may be quadrangle, rectangular, circular, and elliptical.

The first excitation electrode 25a and the second excitation electrode 25b are different in size, and the second excitation electrode 25b is larger than the first excitation electrode 25a. A region which is actually excited in the vibrating portion 12 is a region interposed between the first excitation electrode 25a and the second excitation electrode 25b. In other words, in the second excitation electrode 25b, a region actually contributing to excitation of the vibrating portion 12 is a portion overlapping the first excitation electrode 25a in a plan view. In other words, the second excitation electrode 25b is configured with an electrode contributing to the excitation and an electrode not contributing to the excitation which is integrated into the outer edge of the electrode contributing to the excitation.

In addition, for explanation of the first excitation electrode 25a and the second excitation electrode 25b, the shapes and areas of the portions in contact with the lead electrodes 27a and 27b will be described, with an extending line (a virtual line) along the outer edge (outer side) of the excitation electrode as a boundary.

It is assumed that the cut-out portions in the first excitation electrode 25a are symmetrical to the center point of the first excitation electrode 25a. Otherwise, it is preferable that the cut-out areas of the four corners be the same with respect to the virtual quadrangle 25f. In addition, in the first excitation electrode 25a, although it is desirable that four areas obtained by cutting the four corners of the virtual quadrangle 25f be respectively the same (approximately equal), in view of production variation, even if the difference of about 10% occurs, it is confirmed that the difference does not affect an actual vibration, and thus there is no problem of affecting the effect achieved in the example of the present embodiment.

The lead electrode 27a extends from the first excitation electrode 25a formed on the concave surface and is conductively connected to the pad electrode 29a formed on the concave surface of the second thick main body 15a through the third inclined portion 16b and the third thick main body 16a from the top of the vibrating portion 12. Further, the lead electrode 27b extends from the second excitation electrode 25b formed on the flat surface and is conductively connected to the pad electrode 29b formed on the flat surface of the second thick main body 15a through the edge portion of the flat surface of the substrate 10.

The embodiment illustrated in FIG. 1A is an example of a structure for drawing out the lead electrodes 27a and 27b, and the lead electrode 27a may pass through another thick portion. However, it is desirable that the lengths of the lead electrodes 27a and 27b be the shortest. It is desirable to suppress an increase in electrostatic capacitance by considering the lead electrodes 27a and 27b so as not to intersect across the substrate 10.

Further, the first excitation electrode 25a, the second excitation electrode 25b, the lead electrodes 27a and 27b, and the pad electrodes 29a and 29b are formed using a deposition apparatus, or a sputtering apparatus in such a manner that for example, a film of nickel (Ni) is formed as a lower layer and a film of gold (Au) is formed as an upper layer so as to be laminated, and is subjected to patterning by photolithography. In addition, chromium (Cr) may be used instead of nickel (Ni) as the lower layer and silver (Ag) and platinum (Pt) may be used instead of gold (Au) as the upper layer.

Next, the substrate 10 of the resonator element 1 according to the present embodiment will be described.

Figure 2:
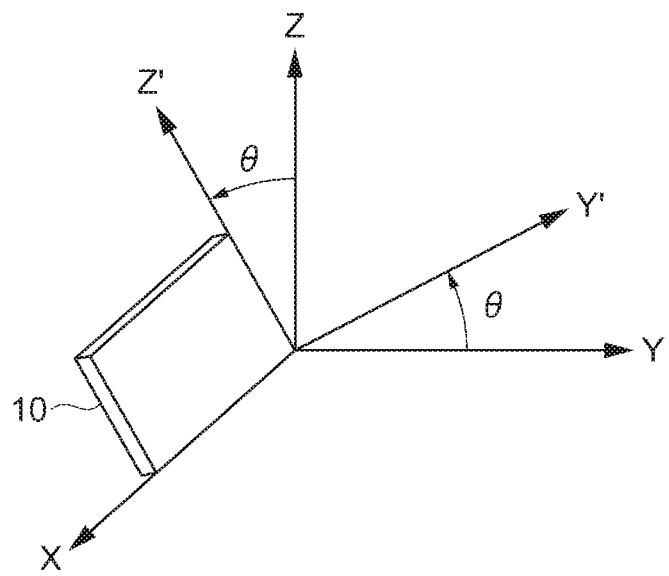
FIG. 2 is a diagram describing a relationship between an AT cut quartz crystal substrate and crystal axes.

FIG. 2 is a diagram describing a relationship between an AT cut quartz crystal substrate and crystal axes.

A piezoelectric material such as quartz crystal belongs to a trigonal system, and has crystal axes X, Y, and Z which are orthogonal to each other as illustrated in FIG. 2. The X axis, the Y axis, and the Z axis are respectively referred to as an electric axis, a mechanical axis, and an optical axis. Then, "rotation Y cut quartz crystal substrate" obtained by cutting quartz crystal along a plane obtained by rotating an XZ plane about the X axis by a predetermined angle $\theta$ is used as the substrate 10. For example, in the case of the AT cut quartz crystal substrate, an angle $\theta$ is about 35°15'. In addition, the axes obtained by rotating the Y axis and the Z axis about the X axis by $\theta$ are respectively referred to as a Y' axis and a Z' axis. Accordingly, the AT cut quartz crystal substrate has crystal axes X, Y', and Z' which are orthogonal to each other. The thickness direction of the AT cut quartz crystal substrate is the Y' axis, and a XZ' plane (plane including the X axis and the Z' axis) orthogonal to the Y' axis is a main surface, and the AT cut quartz crystal substrate is excited by using the thickness shear vibration as main vibration.

In other words, the substrate 10 is the "rotation Y cut quartz crystal substrate" in which the X axis of an orthogonal coordinate system formed of the X axis (electric axis), the Y axis (mechanical axis), and the Z axis (optical axis) as illustrated in FIG. 2 is set to a rotation axis, an axis obtained by inclining the Z axis such that +Z side rotates in the −Y direction of the Y axis is set to a Z' axis, an axis obtained by inclining the Y axis such that +Y side rotates in the +Z direction of the Z axis is set to a Y' axis, a plane including the X axis and the Z' axis is set to a main surface, and a direction along the Y' axis is a thickness direction.

In addition, the substrate 10 according to the present embodiment is not limited to the AT cut in which the angle $\theta$ is approximately 35°15', but can be widely applied to the substrate of BT cut or the like that is excited by the thickness shear vibration.

Further, a description has been made by using an example in which the thick portion is provided along the outer edge of the vibrating portion 12, but is not limited thereto, and the present embodiment can be widely applied to a substrate in which a thick portion is provided along the outer edge of the entire circumference of the vibrating portion 12, or a substrate of a flat plate shape in which the thick portion is not provided.

Here, according to the resonator element 1 according to the present embodiment, there is an effect of obtaining a resonator element that has a high Q value and has an excellent temperature characteristic, by using the AT cut quartz crystal substrate having a cutting angle with an excellent temperature characteristic as the substrate 10. Further, since it is possible to take advantage of performance and experience relating to a photolithography technology and an etching technology, the mass production of the resonator element is possible which has the excellent temperature characteristic, and has a small variation in characteristics such as frequency reproducibility, a frequency-temperature characteristic, a CI-temperature characteristic, and a frequency aging characteristic.

Next, a voltage controlled oscillator on which the resonator element 1 according to the present embodiment is mounted will be described.

Generally, the voltage controlled oscillator is configured with the resonator element 1 and a control voltage terminal including an oscillation circuit unit and a variable capacity diode. An important specification is a frequency variable range within which the oscillation frequency of the resonator element 1 is changed by a control voltage. Since the frequency variable range is the sum of an absolute frequency variable range (APR) required in transmission communication equipment or the like and a frequency tolerance (room temperature frequency deviation, a frequency-temperature characteristic, frequency variation due to a power supply voltage, frequency variation due to a load, frequency variation due to reflow, and frequency fluctuation due to changes over time), the voltage controlled oscillator itself supplements the frequency variation amount due to an environmental change outside of the oscillator and an oscillation circuit condition change. Therefore, since it is possible to mitigate the frequency tolerance due to manufacturing and design by widening a frequency variable range, the widening is significantly important in order to improve the manufacturing yield of the resonator element 1.

Here, the frequency variable sensitivity S of the voltage controlled oscillator is expressed by the following equation (1).

$$S = -\Delta CL/(2 \times \gamma \times C0 \times (1+CL/C0)^2) \quad (1)$$

Here, ΔCL is a load capacitance change, γ is a capacitance ratio (C0/C1), C0 is an equivalent parallel capacitance, and CL is a load capacitance.

By equation (1), if the load capacitance CL configured in the oscillation circuit is constant, the frequency variable sensitivity S is determined by the equivalent parallel capacitance C0 and the capacitance ratio γ of the resonator element 1, and particularly, is greatly affected by the capacitance ratio γ. Accordingly, if the capacitance ratio γ is small, it is possible to increase the frequency variable sensitivity S of the voltage controlled oscillator, thereby improving the manufacturing yield of the resonator element 1.

Next, the vibration displacement of the resonator element 1a will be described.

Figure 3A:
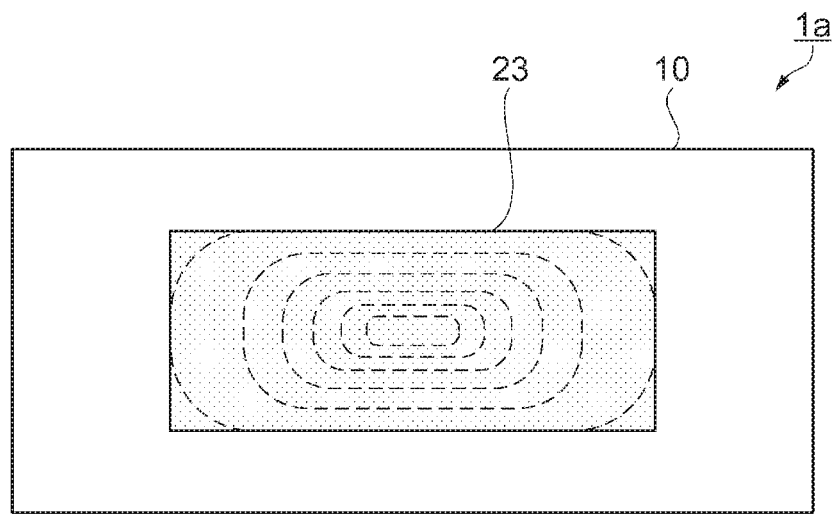
FIGS. 3A and 3B are explanatory views illustrating a vibration displacement distribution of the resonator element having a provided excitation electrode.
Figure 3B:
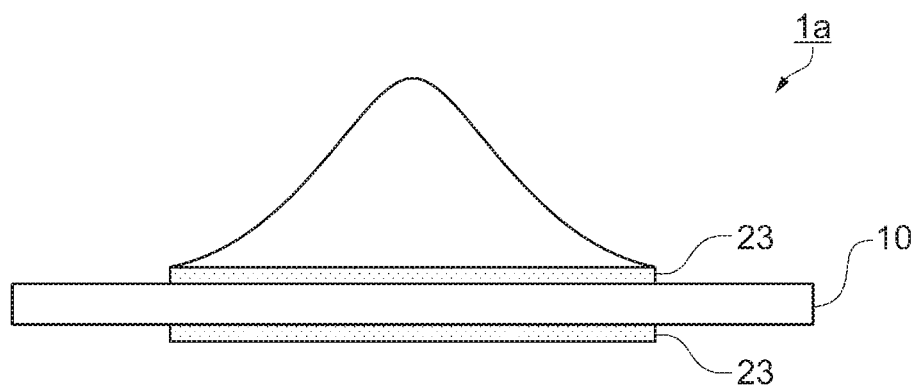

FIGS. 3A and 3B are explanatory views illustrating a vibration displacement distribution of the resonator element having a provided excitation electrode, FIG. 3A is a plan view, and FIG. 3B is a longitudinal sectional diagram of FIG. 3A.

FIGS. 3A and 3B illustrate a result obtained by calculating the vibration displacement distribution in the thickness shear vibration mode of a fundamental wave of the resonator element 1a in which the excitation electrode 23 having a rectangular shape is formed on the substrate 10 by a finite element method. From FIGS. 3A and 3B, it is ascertained that four corners of the excitation electrode 23 have a significantly small vibration displacement, and do not contribute to an actual vibration. Here, since the equivalent parallel capacitance C0 of the resonator element 1a is an electrostatic capacitance between the front and back excitation electrodes, it depends on an opposite area. However, since the equivalent series capacitance C1 is a capacitance component in an actual vibration region, if the area of the excitation electrode 23 is sufficiently large, it does not depend on the opposite area. Therefore, it is possible to reduce only the equivalent parallel capacitance C0 so as to obtain the resonator element 1a with a small capacitance ratio γ, without affecting the equivalent series capacitance C1, by removing a portion of the excitation electrode 23 not contributing to actual vibration.

Next, the spurious vibration affecting the main vibration will be described.

Generally, the spurious vibration affecting the thickness shear vibration which is the main vibration is referred to as an inharmonic overtone mode of the thickness shear vibration, and is a (1, 2, 1) mode as a second-order mode or a (1, 3, 1) mode as a third-order mode of the vibration displacement distribution in the long side direction of the substrate 10 in FIG. 3A.

In the (1, 2, 1) mode as the second-order mode, there are two vibration displacement distributions along the long side direction of the substrate 10, with the center portion of the excitation electrode 23 as a boundary. Since the polarities of charges generated in the two vibration displacement distributions are contradictory, the charges are cancelled so as not to commonly vibrate as the spurious vibration. However, when there is a variation in the plane parallelism degree of the thickness of the vibrating portion, the amounts of charges having different polarities generated in the two vibration displacement distributions are different, and the charges are not cancelled so as to vibrate as the spurious vibration. Further, the frequency is higher than the frequency of the main vibration, and is closest to the frequency of the main vibration.

The (1, 3, 1) mode as the third-order mode has three vibration displacement distributions in the long side direction of the substrate 10. Since the polarities of charges generated in one vibration displacement distribution on the center portion of the excitation electrode 23 and two vibration displacement distributions on the edge portion sides of the excitation electrode 23 are contradictory and the amounts of charges having different polarities are different, the charges commonly vibrate as spurious vibration. Further, the frequency is higher than the frequency of the main vibration, and is closest to the frequency of the main vibration when the (1, 2, 1) mode does not vibrate.

If the excitation electrode is formed into a shape in which the peripheral portions are cut, the area of the excitation electrode on the vibration displacement distribution of the spurious vibration is reduced as if the film thickness of the excitation electrode is reduced, the frequency of the spurious vibration of inharmonic overtone mode of the thickness shear vibration described above is increased. Further, even if the excitation electrode is formed into a shape in which the peripheral portions are cut, the cut-out portions do not contribute to an actual vibration, and thus the frequency of the main vibration hardly changes. Therefore, it is possible to achieve the resonator element 1 in which the frequency difference between the main vibration and the spurious vibration is increased by forming the excitation electrode into a shape in which the peripheral portions are cut, and thus the frequency jump phenomenon due to the coupling with the spurious vibration is reduced.

Figures 4, 5:
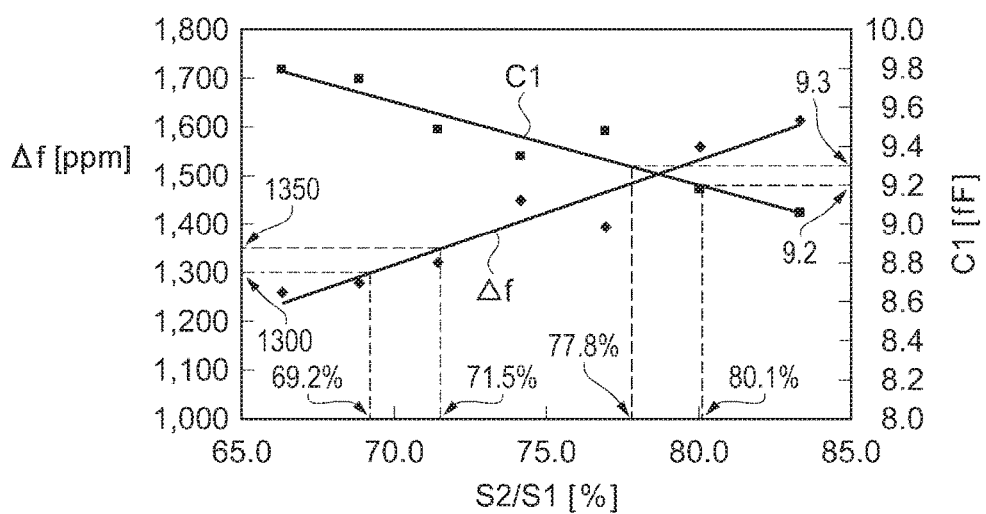
FIG. 4 is a diagram representing an experimental production condition and a measurement result of the AT cut quartz crystal resonator element.
FIG. 5 is a diagram representing C1 values and the frequency difference Δf values of the resonator element with respect to the area ratio of the excitation electrode.

FIG. 4 represents an experimental production condition and the measurement result of an AT cut quartz crystal resonator element having a resonant frequency of a 114 MHz band which is experimentally produced in the embodiment of FIGS. 1A to 1C. Further, FIG. 5 is a diagram in which C1 values and the frequency difference Δf values between the main vibration and the spurious vibration with respect to the area ratio (S2/S1) of the excitation electrode of the AT cut quartz crystal resonator element illustrated in FIG. 4 are plotted on graphs.

The experimental production condition of the experimentally produced AT cut quartz crystal resonator element (resonator element 1) having a resonant frequency of a 114 MHz band is that the area S1 of the virtual quadrangle 25f made of the length hx along the X axis direction and the length hz along the Z' axis direction, illustrated in FIGS. 1A to 1C, is changed in a range of 0.564 mm² to 0.705 mm², and the area S2 of the first excitation electrode 25a of which sides are inscribed to the virtual quadrangle 25f is constant at 0.470 mm². Further, the measurement result represents the equivalent series capacitance C1 of the AT cut quartz crystal resonator element (resonator element 1) in the experimental production condition and a frequency difference Δf between the main vibration and the spurious vibration which is closest to the frequency of the main vibration. Further, the frequency difference Δf is represented by normalization at the frequency of the main vibration, and the equivalent parallel capacitance C0 is 2.76 pF because the area S2 of the first excitation electrode 25a is constant at 0.470 mm².

FIG. 5 shows a tendency in which the equivalent series capacitance C1 is reduced and a tendency in which the frequency difference Δf is increased, as the area ratio (S2/S1) is increased. Here, if the voltage controlled oscillator sets the specification of the capacitance ratio γ required for the resonator element 1 to 300 or less (since the equivalent parallel capacitance C0 is 2.76 pF, the equivalent series capacitance C1 is 9.2 fF or more), and sets the specification of the frequency difference Δf between the main vibration and the spurious vibration to 1,300 ppm or more, the area ratio (S2/S1) satisfying the condition is in a range of 69.2%≤(S2/S1)≤80.1% from the graph of FIG. 5. Therefore, since the first excitation electrode 25a is formed into a shape in which the peripheral portion is cut out and the area ratio (S2/S1) satisfies the relationship of 69.2%≤(S2/S1)≤80.1%, it is possible to obtain an AT cut quartz crystal resonator element (resonator element 1) in which the capacitance ratio γ is 300 or less and the frequency difference Δf between the main vibration and the spurious vibration is 1,300 ppm or more.

Further, in view of the production variation, if the specification of the capacitance ratio γ is set to 297 or less (C1 is 9.3 fF or more), the specification of the frequency difference Δf is set to 1,350 ppm or more, it is preferable that the area ratio (S2/S1) be in a range of 71.5%≤(S2/S1)≤77.8%. Further, if the specification of the capacitance ratio γ is set to 294 or less (C1 is 9.4 fF or more), and the specification of the frequency difference Δf is set to 1,400 ppm or more, it is preferable that the area ratio (S2/S1) be in a range of 73.8%≤(S2/S1)≤75.4%.

Next, returning to FIGS. 1A to 1C, in the embodiment illustrated in FIG. 1A, the size of the area of the first excitation electrode 25a on the concave surface side (front surface side in FIG. 1B) is set to such a size as to fit into the inside of the outer edge of the outer shape of the excitation electrode 25b on the flat surface side (back surface side in FIG. 1B). In other words, the first excitation electrode 25a is formed into a shape smaller than the second excitation electrode 25b.

Since the thickness shear vibration is performed only in a region in which the first excitation electrode 25a and the second excitation electrode 25b overlap in a plan view, if the first excitation electrode 25a fits into the inside of the outer edge of the second excitation electrode 25b, efficient trapping of the vibration energy of the main vibration can be determined from the area and the thickness of the first excitation electrode 25a. Therefore, since it is possible to increase the thickness of the electrode as compared to a case where the areas of the first excitation electrode 25a and the second excitation electrode 25b are the same, it is possible to reduce the ohmic loss of the electrode film, and reduce the deterioration of the CI value of the main vibration.

Further, even when the first excitation electrode 25a and the second excitation electrode 25b are formed by a metal mask method, even if there is some positional shift at the time of forming an electrode, it is difficult to change the opposing area of the first excitation electrode 25a and the second excitation electrode 25b across the vibrating portion 12, such that it is possible to obtain the resonator element 1 in which the variation in the equivalent series capacitance C1 and the equivalent parallel capacitance C0 is unlikely to occur and the variation of the capacitance ratio γ is small.

Further, when the length along the thickness shear vibration direction of the first excitation electrode 25a is set to hx and the length along the direction orthogonal to the thickness shear vibration direction is set to hz, in a case of the AT cut quartz crystal substrate, the dimension ratio hx/hz of the excitation electrode is set to 1.28, thereby allowing the vibration energy of the main vibration to be efficiently trapped in the region of the excitation electrode. Therefore, since it is possible to efficiently trap the vibration energy of the main vibration by making the dimension ratio hx/hz of the excitation electrode have a relationship of 1.25≤hx/hz≤1.31, in view of the production variation, thereby increasing the equivalent series capacitance C1 and obtaining the resonator element 1 in which the capacitance ratio γ is smaller.

Figure 6A:
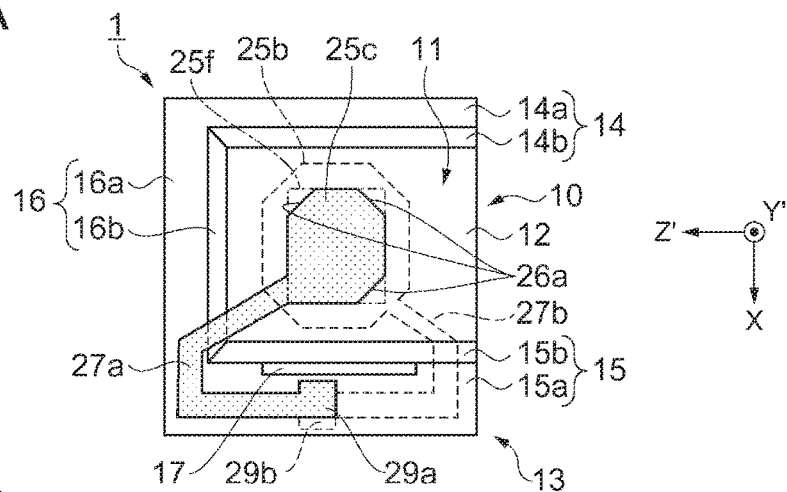
FIGS. 6A to 6C are schematic diagrams illustrating a structure of a resonator element according to the modification example of the invention.
Figure 6B:
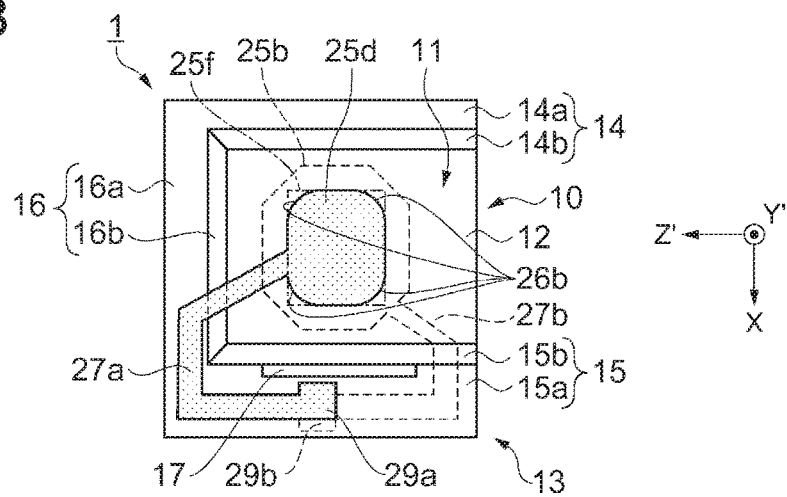
Figure 6C:
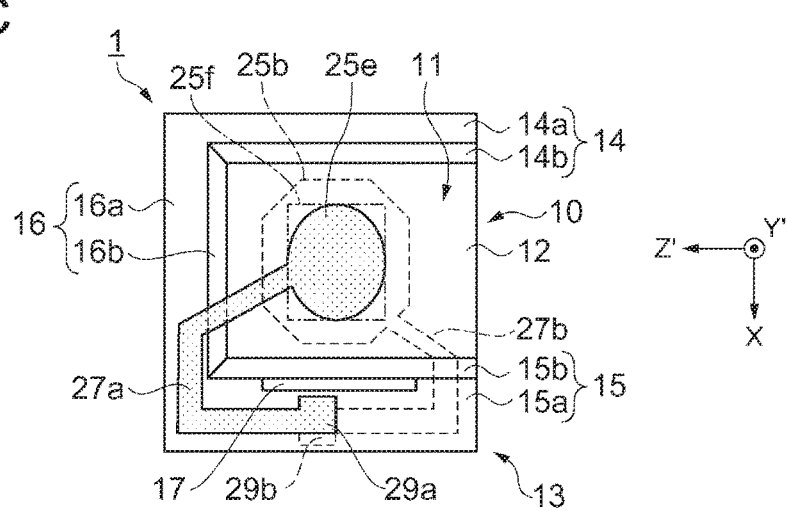

Hitherto, although a description has been made based on the embodiment illustrated in FIGS. 1A to 1C, the invention is not limited thereto, and it is ascertained that it is possible to widen the distance between the main vibration frequency and the spurious vibration frequency, and to increase the C1 value (decrease the capacitance ratio γ), even in respective modification examples illustrated in FIGS. 6A to 6C.

Next, a modification example of the resonator element 1 according to an embodiment of the invention will be described.

FIGS. 6A to 6C are schematic diagrams illustrating structures of the resonator elements according to the modification examples of the invention, FIG. 6A is a plan view of a first modification example, FIG. 6B is a plan view of a second modification example, and FIG. 6C is a plan view of a third modification example.

In the first modification example illustrated in FIG. 6A, the first excitation electrode 25c is formed into a shape having cutout portions 26a in the three corners of the virtual quadrangle 25f, and one remaining corner is connected to the lead electrode 27a and thus the cutout portion 26a is not formed therein.

In the second modification example illustrated in FIG. 6B, the first excitation electrode 25d is formed into a shape in which the four corners of the virtual quadrangle 25f have cutout portions 26b having a curve, for example, an arc shape. Further, the lead electrode 27a is formed while extending from the outer edge of the first excitation electrode 25d except for the cutout portions 26b. Therefore, it is possible to reliably reduce the area of the first excitation electrode 25d of the vibration region of the spurious vibration which is concentrated in the peripheral portion of the first excitation electrode 25d and increase the frequency of the spurious vibration, thereby reducing the coupling with the main vibration.

In the third modification example illustrated in FIG. 6C, the first excitation electrode 25e is formed into an elliptical shape in which a circumference is inscribed to the virtual quadrangle 25f. It is possible to achieve an effect capable of efficiently trapping the vibration energy of the main vibration and reducing the capacitance ratio γ, by forming the first excitation electrode 25e into an elliptical shape.

In the modification examples, if the area ratio (S2/S1) satisfies a relationship of 69.2≤(S2/S1)≤80.1%, it is possible to widen the distance between the main vibration frequency and the spurious vibration frequency, and increase the C1 value (reduce the capacitance ratio γ), thereby reducing the frequency jump phenomenon due to coupling with the spurious vibration and obtaining the resonator element 1 having a small capacitance ratio γ.

Resonator

Next, a resonator 2 to which the resonator element 1 described above is applied (resonator according to the invention) will be described.

Figure 7A:
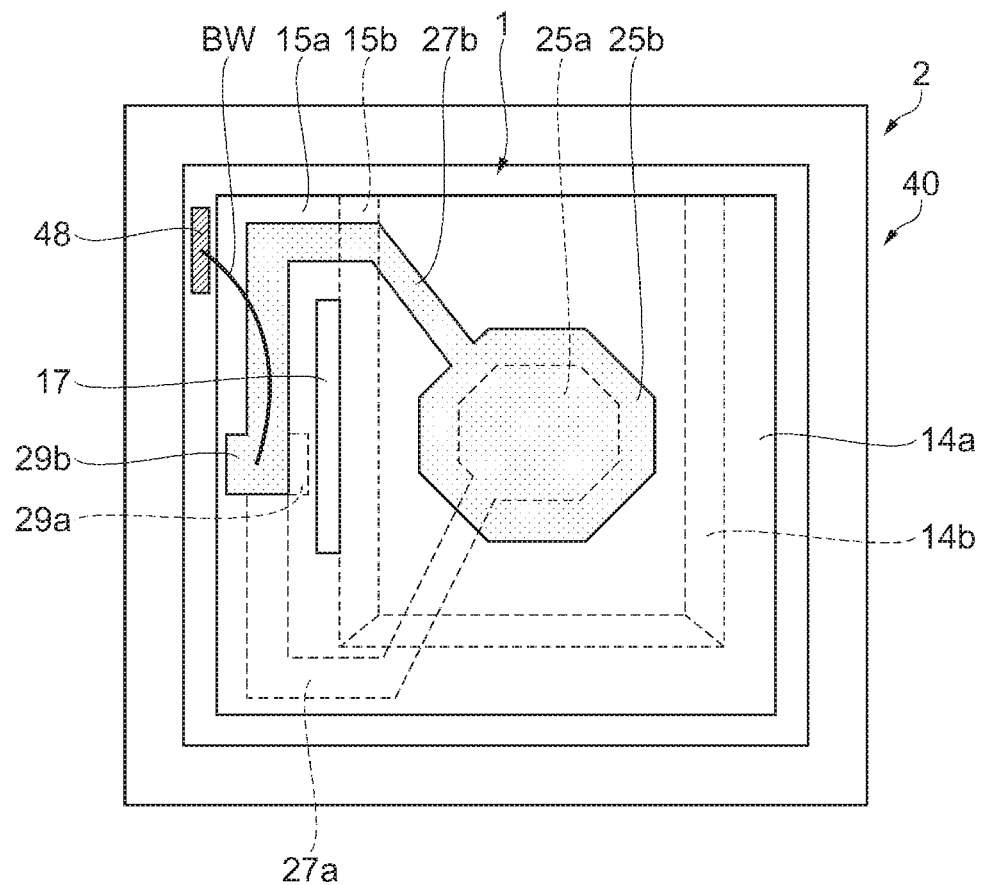
FIGS. 7A and 7B are schematic diagrams illustrating a structure of a resonator.
Figure 7B:
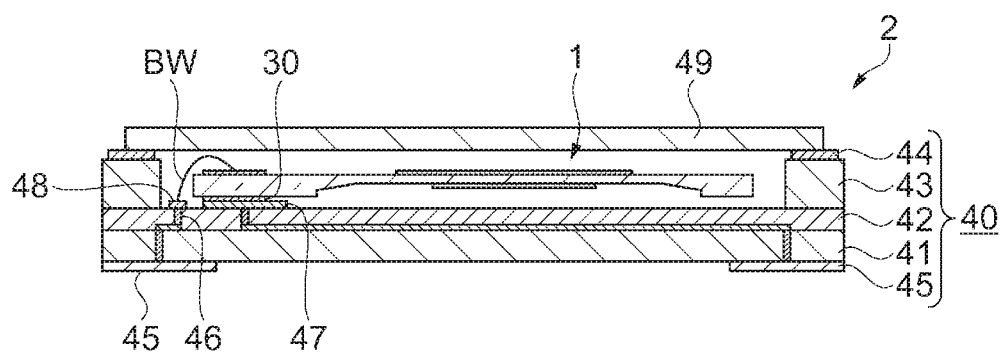

FIGS. 7A and 7B are diagrams illustrating a configuration of a resonator according to an embodiment of the invention, FIG. 7A is a plan view in which a cover member is omitted, and FIG. 7B is a longitudinal sectional view of FIG. 7A. The resonator 2 is configured to include the resonator element 1, a package body 40 formed into a rectangular box shape for accommodating the resonator element 1, and a cover member 49 made from metal, ceramic, glass or the like.

As illustrated in FIGS. 7A and 7B, the package body is formed by laminating a first substrate 41, a second substrate 42, a third substrate 43, a seal ring 44, and amounting terminal 45. A plurality of mounting terminals 45 are formed on an outer bottom surface of the first substrate 41. The third substrate 43 is formed into an annular shape in which the center portion is removed, and for example, a seal ring 44 such as Kovar is formed on the upper peripheral edge of the third substrate 43.

A recess (cavity) accommodating the resonator element 1 is formed of the third substrate 43 and the second substrate 42. A plurality of element mounting pads 47 which are electrically conducted to the mounting terminals 45 by the conductors 46 are provided in a predetermined position on the upper surface of the second substrate 42. The element mounting pad 47 is arranged so as to correspond to the pad electrode 29a formed on the second thick main body 15a when the resonator element 1 is placed.

When fixing the resonator element 1, first, the resonator element 1 is inverted (upside down) and the pad electrode 29a is placed on the element mounting pad 47 to which a conductive adhesive 30 has been applied so as to apply a load. A polyimide-based adhesive with low outgassing is used as the conductive adhesive 30, in view of a change over time.

Next, the resonator element 1 is put in a high-temperature furnace at a predetermined temperature for a predetermined period of time in order to cure the thermosetting conductive adhesive 30 of the resonator element 1 mounted on the package body 40. After curing the conductive adhesive 30, the pad electrode 29b which is the upper surface of the inverted resonator element 1 and the electrode terminal 48 of the package body 40 are conductively connected by the bonding wire BW. As illustrated in FIG. 7B, since a portion of supporting and fixing the resonator element 1 to the package body 40 is located at one place (one point), it is possible to reduce the size of the stress caused by the supporting and fixing.

After an annealing process is performed, the frequency adjustment is performed by adding the mass to the second excitation electrode 25b, or reducing the mass of the second excitation electrode 25b. Thereafter, the resonator 2 is completed by placing the cover member 49 on the seal ring 44 formed on the upper surface of the package body 40, and sealing the cover member 49 through seam welding at a reduced pressure atmosphere or an atmosphere of nitrogen gas. Otherwise, there is a method of placing and adhering through melting the cover member 49 to glass with a low-melting point which has been applied on the upper surface of the third substrate 43 of the package body 40. Also in this case, the resonator 2 is completed by making an inside of the cavity of the package be a reduced pressure atmosphere or filling the cavity with inert gas such as nitrogen gas.

The resonator element 1 in which the pad electrodes 29a and 29b are separated by a distance in the Z' axis direction may be configured. Even in this case, it is possible to configure the resonator similarly to the resonator 2 described in FIG. 9. Further, the resonator element 1 in which the pad electrodes 29a and 29b are formed while being separated by a distance on the same surface may be configured. In this case, the resonator element 1 has a configuration in which a conductive adhesive 30 has been applied on two places (two points) for achieving conduction, supporting and fixing. Although the structure is suitable for reducing a height, there is a concern that the mount stress caused by the conductive adhesive 30 is slightly increased.

Although an example of using laminated plates in the package body 40 has been described in the embodiment of the above resonator 2, the resonator may be configured by using a single-layer ceramic plate as the package body 40 and a cap that has been subjected to a squeezing process as the cover.

As illustrated in FIGS. 7A and 7B, the portion of supporting the resonator element 1 is location at one point, and a slit 17 is provided between the thick portion 13 and the vibrating portion 12, this allows stress caused by the conductive adhesive 30 to be reduced, and thus there is an effect of achieving the resonator 2 with excellent frequency reproducibility, a frequency-temperature characteristic, a CI-temperature characteristic, and a frequency aging characteristic.

Electronic Device

Next, an oscillator to which the resonator element 1 described above (an electronic device according to the invention) is applied will be described.

Figure 8A:
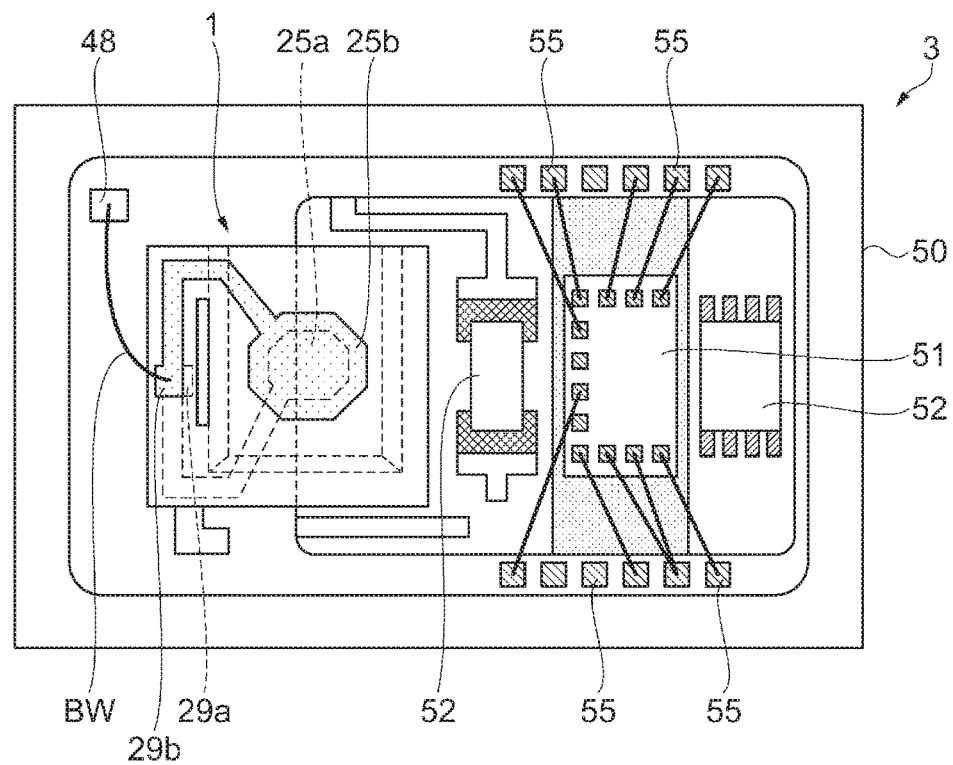
FIGS. 8A and 8B are schematic diagrams illustrating a structure of an electronic device according to an embodiment of the invention.
Figure 8B:
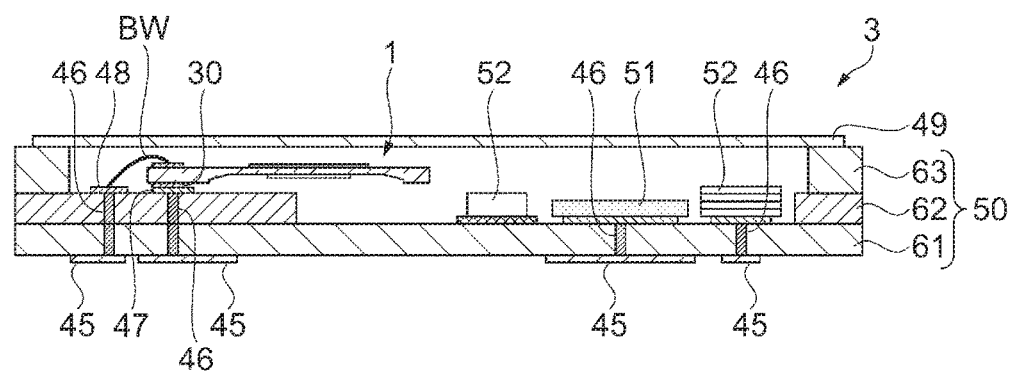

FIGS. 8A and 8B are diagrams illustrating a configuration of an electronic device according to an embodiment of the invention, FIG. 8A is a plan view in which a cover member is omitted, FIG. 8B is a longitudinal sectional view of FIG. 8A. The electronic device 3 includes a package body 50, a cover member 49, the resonator element 1, an IC component 51 equipped with an oscillation circuit that excites the resonator element 1, and at least one of electronic components 52 such as a variable capacitor in which capacitance is changed by a voltage, a thermistor in which a resistance is changed by a temperature, or an inductor.

The package body 50, as illustrated in FIGS. 8A and 8B, is formed by laminating a first substrate 61, a second substrate 62, and a third substrate 63. A plurality of mounting terminals 45 are provided on an outer bottom surface of the first substrate 61. The second substrate 62 and the third substrate 63 are formed into an annular shape in which the center portion is removed.

A recess (cavity) accommodating the resonator element 1, the IC component 51, the electronic component 52, and the like is formed by the first substrate 61, the second substrate 62, and the third substrate 63. A plurality of element mounting pads 47 which are electrically conducted to the mounting terminals 45 by the conductors 46 are provided in a predetermined position on the upper surface of the second substrate 62. The element mounting pad 47 is arranged so as to correspond to the pad electrode 29a formed on the second thick main body 15a when the resonator element 1 is placed.

The conduction between the pad electrode 29a and the element mounting pad 47 is achieved by placing the pad electrode 29a of the inverted resonator element 1 on the element mounting pad 47 of the package body 50 which has been applied with a conductive adhesive (polyimide-based) 30. The conduction to one electrode terminal 55 of the IC component 51 through a conductor (not shown) formed between the substrates of the package body 50 is achieved by connecting the pad electrode 29b which is an upper surface of the inverted resonator element 1 and the electrode terminal 48 of the package body 50 through a bonding wire BW. The IC component 51 is fixed in a predetermined position of the package body 50, and the terminal of the IC component 51 and the electrode terminal 55 of the package body 50 are connected by the bonding wire BW. Further, the electronic component 52 is placed in a predetermined position of the package body 50, and is connected to the conductor 46 by using a metal bump. The electronic device 3 is completed by filling the package body 50 with inert gas such as nitrogen or making the package body 50 be a reduced-pressure atmosphere, and sealing the package body 50 with the cover member 49.

In a method of connecting the pad electrode 29b and the electrode terminal 48 of the package body 50 through the bonding wire BW, a portion supporting the resonator element 1 is located at one place (one point), and the mounting stress due to the conductive adhesive 30 is reduced. Further, in accommodating the resonator element 1 in the package body 50, the greater second excitation electrode 25b is the upper surface by inverting the resonator element 1, and thus the frequency adjustment of the electronic device 3 is facilitated.

There is an effect of achieving a voltage-controlled resonator in which the capacitance ratio is reduced, the frequency variable width is wide, and which has a good S/N ratio, by using the resonator element 1 of a high frequency that is excited by a fundamental wave, by configuring the electronic device 3 as illustrated in FIGS. 8A and 8B.

Further, it is possible to configure an oscillator and a temperature compensated oscillator as the electronic device 3, and there is an effect of being capable of configuring an oscillator with excellent frequency reproducibility, an aging characteristic, and a frequency-temperature characteristic.

Electronic Apparatus

Subsequently, an electronic apparatus to which the resonator element 1 according to the embodiment of the invention (the electronic apparatus according to the invention) is applied will be described in detail based on FIG. 9 to FIG. 11.

Figure 9:
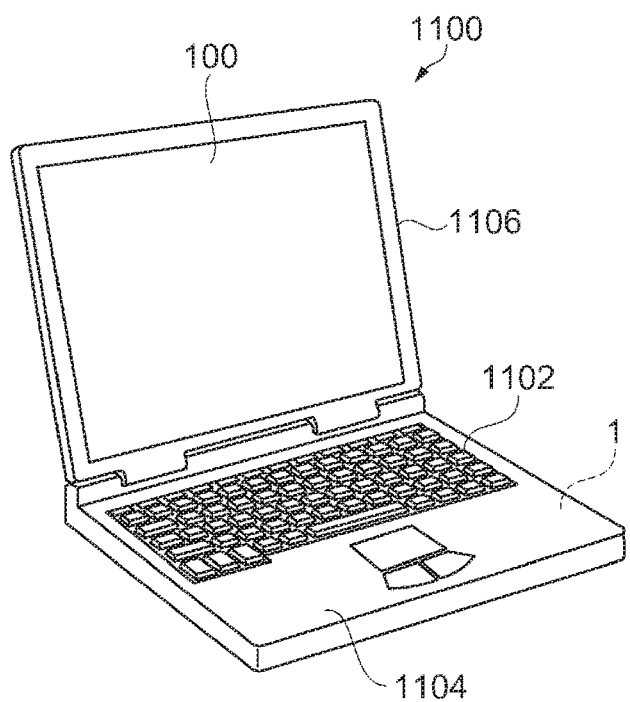
FIG. 9 is a perspective view illustrating a configuration of a mobile type (notebook type) personal computer to which the electronic apparatus including the resonator element according to the embodiment of the invention is applied.

FIG. 9 is a perspective view illustrating a configuration of a mobile type (notebook type) personal computer which is an electronic apparatus including the resonator element according to the embodiment of the invention. In FIG. 9, the personal computer 1100 is configured to include a main body unit 1104 having a keyboard 1102 and a display unit 1106 having a display 100, and the display unit 1106 is rotatably supported to the main body unit 1104 through a hinge structure. The resonator element 1 functioning as a filter, a resonator, and a reference clock is built into the personal computer 1100.

Figure 10:
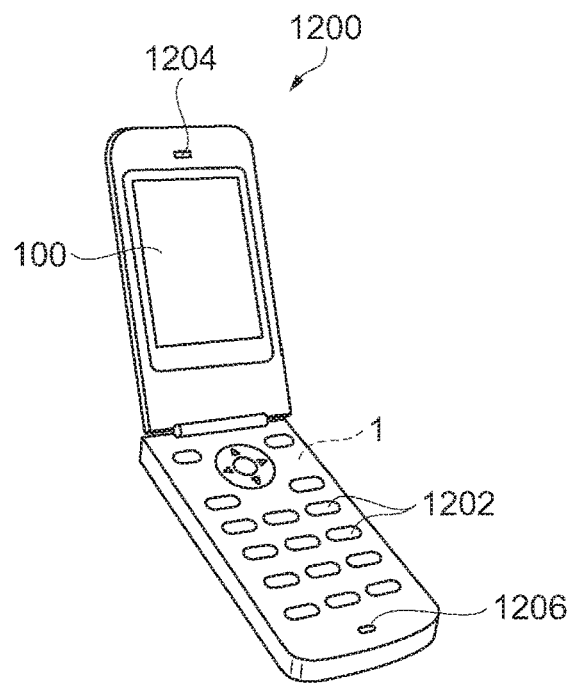
FIG. 10 is a perspective view illustrating a configuration of a mobile phone (including a PHS) to which the electronic apparatus including the resonator element according to the embodiment of the invention is applied.

FIG. 10 is a perspective view illustrating a configuration of a mobile phone (including a PHS) which is an electronic apparatus including the resonator element according to the embodiment of the invention. In FIG. 10, the mobile phone 1200 includes a plurality of operation buttons 1202, an earpiece 1204, and a mouthpiece 1206, and a display 100 is disposed between the operation button 1202 and the earpiece 1204. The resonator element 1 functioning as a filter and a resonator is built into the mobile phone 1200.

Figure 11:
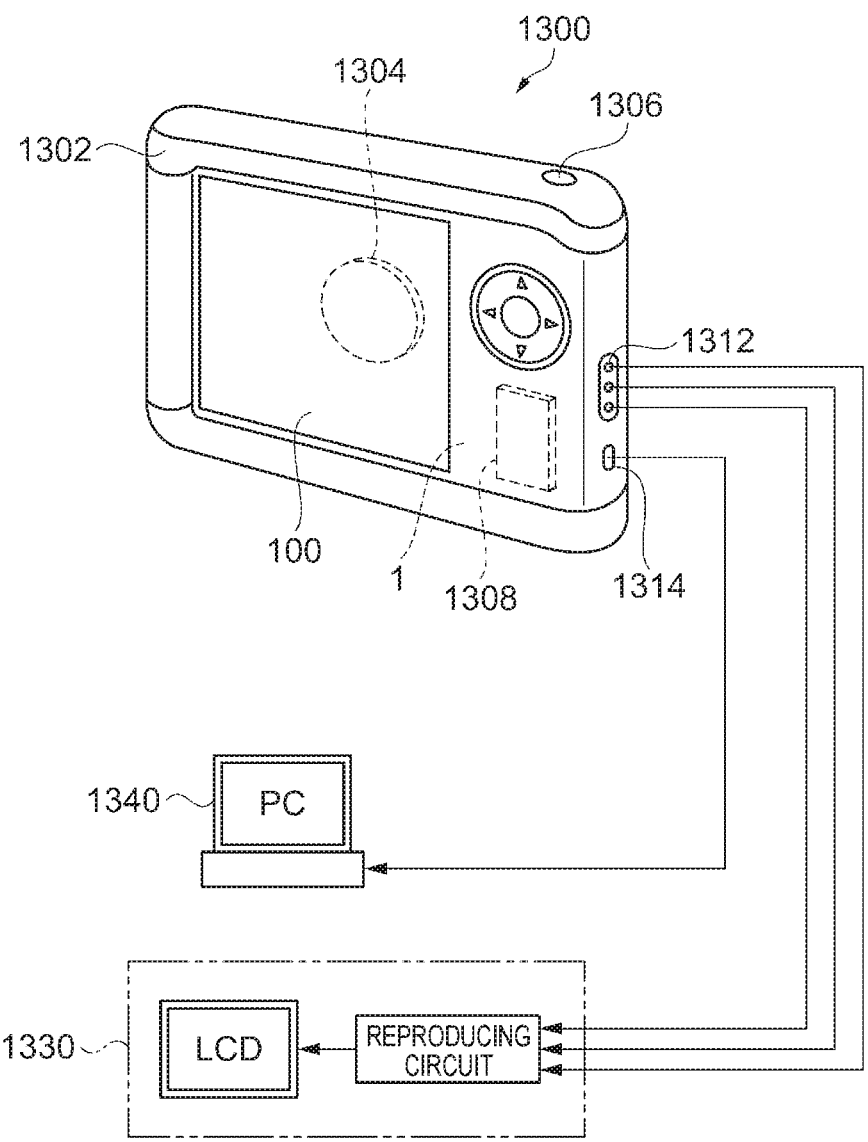
FIG. 11 is a perspective view illustrating a configuration of a digital still camera to which the electronic apparatus including the resonator element according to the embodiment of the invention is applied.

FIG. 11 is a perspective view illustrating a configuration of a digital still camera which is an electronic apparatus including the resonator element according to the embodiment of the invention. In addition, in FIG. 11, the connection to external devices is briefly illustrated. Whereas a common camera exposes a silver halide photographic film with an optical image of an object, a digital still camera 1300 generates an imaging signal (image signal) by photo-electrically converting an optical image of an object by using an imaging device such as a Charge Coupled Device (CCD).

The display 100 is provided on a rear surface of a case (body) 1302 of the digital still camera 1300 and is configured to perform display based on the imaging signal by the CCD. The display 100 functions as a viewfinder that displays the object as an electronic image. Further, a light receiving unit 1304 including optical lenses (an imaging optical system) and a CCD is provided on the front surface side (the back surface side in FIG. 11) of the case 1302.

If a photographer checks an object image displayed on the display 100 and presses a shutter button 1306, the imaging signal of the CCD at this time is transmitted to and stored in a memory 1308. Further, in the digital still camera 1300, a video signal output terminal 1312 and an input-output terminal 1314 for data communication are provided on the side surface of the case 1302. Then, as illustrated, a television monitor 1330 is to be connected to the video signal output terminal 1312 and a personal computer 1340 is to be connected to the input-output terminal 1314 for data communication respectively, as necessary. Further, the imaging signal stored in the memory 1308 is output to the television monitor 1330 or the personal computer 1340 by a predetermined operation. The resonator element 1 functioning as a filter and a resonator is built into the digital still camera 1300.

In addition to the personal computer 1100 (mobile type personal computer) of FIG. 9, the mobile phone 1200 of FIG. 10, and the digital still camera 1300 of FIG. 11, the resonator element 1 according to an embodiment of the invention can be applied to, for example, an ink jet ejection device (for example, an ink jet printer), a laptop type personal computer, a television, a video camera, a video tape recorder, a car navigation device, a pager, an electronic organizer (including a communication function), an electronic dictionary, a calculator, an electronic game machine, a word processor, a workstation, a video phone, a security television monitor, electronic binoculars, a POS terminal, medical equipment (for example, an electronic thermometer, a blood pressure meter, a blood glucose meter, an electrocardiogram measuring device, an ultrasonic diagnostic apparatus, an electronic endoscope), a fish group finder, various measurement equipment, a gauge (for example, gauges of a vehicle, an aircraft, and a ship), a flight simulator, and the like.

Moving Object

Next, a moving object to which the resonator 2 with the resonator element 1 according to an embodiment of the invention is applied (a moving object according to the invention) will be described based on FIG. 12.

Figure 12:
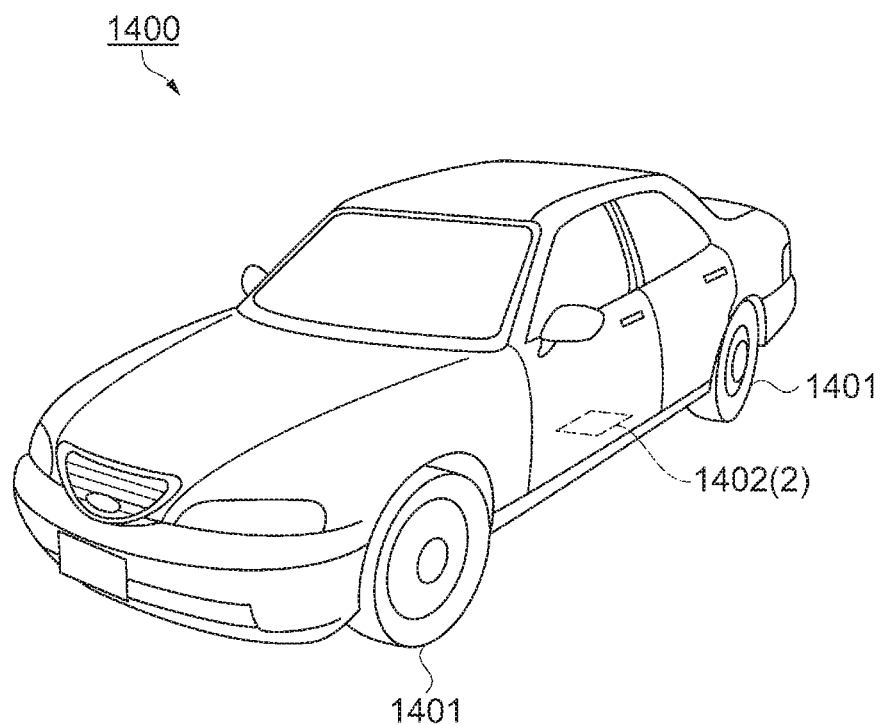
FIG. 12 is a perspective view schematically illustrating a vehicle which is an example of a moving object according to the invention.

FIG. 12 is a perspective view schematically illustrating a vehicle 1400 which is a moving object including a resonator 2. A gyro sensor which is configured to include the resonator 2 according to an embodiment of the invention is mounted on the vehicle 1400. For example, as illustrated in FIG. 12, an electronic control unit 1402 equipped with a gyro sensor that controls a tire 1401 is mounted in the vehicle 1400 which is the moving object. Further, as another example, the resonator 2 can be widely applied to an electronic control unit (ECU) such as a keyless entry, an immobilizer, a car navigation system, a car air conditioner, an anti-lock brake system (ABS), an airbag, a tire pressure monitoring system (TPMS), an engine controller, a battery monitor of a hybrid vehicle or an electric vehicle, and a body attitude control system.

As described above, the moving object includes the resonator 2 with the resonator element 1 in which the influence of spurious vibration is suppressed and which has good vibration characteristics, such that it is possible to provide the moving object of a higher performance.

Hitherto, the resonator element 1, the resonator 2, the electronic device 3, the electronic apparatus and the moving object according to the invention have been described based on the illustrated embodiments, but the invention is not limited thereto, and the configuration of each unit may be replaced with any configuration having a similar function. Further, other arbitrary components may be added to the invention. Further, the respective embodiments described above may be appropriately combined.

What is claimed is:

1. A resonator element comprising:
    a substrate that is configured to perform a thickness shear vibration, the substrate having first and second main surfaces opposite to each other;
    a first excitation electrode that is provided on the first main surface; and
    a second excitation electrode that is provided on the second main surface, the second excitation electrode overlapping the first excitation electrode in a plan view,
    wherein when an imaginary quadrangle having first, second, third, and fourth sides is drawn to overlap the first excitation electrode in the plan view, wherein the first and second sides are parallel to each other and the third and fourth sides are parallel to each other, a periphery of the first excitation electrode in the plan view is configured with:
        a first edge that has a linear element aligned with the first side;
        a second edge that has a linear element aligned with the second side;
        a third edge that has a linear element aligned with the third side;
        a fourth edge that has a linear element aligned with the fourth side;
        a fifth edge that has a curve element connected between ends of the first and third edges;
        a sixth edge that has a curve element connected between ends of the first and fourth edges;
        a seventh edge that has a curve element connected between ends of the second and third edges; and
        an eighth edge that has a curve element connected between ends of the second and fourth edges, wherein the fifth, sixth, seventh, and eighth edges are inwardly located from corresponding corners of the imaginary quadrangle,
    a first length of the first excitation electrode along the first side is longer than a second length of the first excitation electrode along the third side, and wherein:
    S1 is an area of the imaginary quadrangle,
    S2 is an area of the first excitation electrode, and
    $69.2\% \leq (S2/S1) \leq 80.1\%$.

2. The resonator element according to claim 1,
    wherein hx is the first length,
    hz is the second length, and
    $1.25 \leq hx/hz \leq 1.31$.

3. The resonator element according to claim 1,
    wherein the first excitation electrode is inside a periphery of the second excitation electrode in the plan view.

4. The resonator element according to claim 1, further comprising:
    a lead electrode extending from the first edge of the first excitation electrode.

5. The resonator element according to claim 1,
    wherein the substrate is a quartz crystal substrate.

6. The resonator element according to claim 5,
    wherein the quartz crystal substrate is an AT cut quartz crystal substrate.

7. The resonator element according to claim 1,
    wherein the substrate is configured with:
        a vibration member on which the first and second excitation electrodes are provided, and the vibration member has a first thickness; and
        a thick member that is provided directly adjacent to the vibration member, the thick member has a second thickness which is larger than the first thickness,
    the first, second, third, and fourth edges are provided on the vibration member, and
    the thick member is provided only along the first, third, and fourth edges.

8. The resonator element according to claim 2,
    wherein the substrate is configured with:
        a vibration member on which the first and second excitation electrodes are provided, and the vibration member has a first thickness; and
        a thick member that is provided directly adjacent to the vibration member, the thick member has a second thickness which is larger than the first thickness,
    the first, second, third, and fourth edges are provided on the vibration member, and
    the thick member is provided only along the first, third, and fourth edges.

9. The resonator element according to claim 5,
    wherein the quartz crystal substrate is configured with:
        a vibration member on which the first and second excitation electrodes are provided, and the vibration member has a first thickness; and
        a thick member that is provided directly adjacent to the vibration member, the thick member has a second thickness which is larger than the first thickness,
    the first, second, third, and fourth edges are provided on the vibration member, and
    the thick member is provided only along the first, third, and fourth edges.

10. A resonator comprising:
    the resonator element according to claim 1; and
    a package that accommodates the resonator element.

11. A resonator comprising:
    the resonator element according to claim 2; and
    a package that accommodates the resonator element.

12. A resonator comprising:
    the resonator element according to claim 5; and
    a package that accommodates the resonator element.

13. A resonator comprising:
    the resonator element according to claim 7; and
    a package that accommodates the resonator element.

14. An electronic device comprising:
    the resonator element according to claim 1; and
    an oscillation circuit that drives the resonator element.

15. An electronic device comprising:
the resonator element according to claim 2; and
an oscillation circuit that drives the resonator element.
16. An electronic device comprising:
the resonator element according to claim 5; and
an oscillation circuit that drives the resonator element.
17. An electronic device comprising:
the resonator element according to claim 7; and
an oscillation circuit that drives the resonator element.

\* \* \* \* \*